United States Patent [19]

Nishizawa et al.

[11] Patent Number: 5,132,896
[45] Date of Patent: Jul. 21, 1992

[54] INVERTER UNIT WITH IMPROVED BUS-PLATE CONFIGURATION

[75] Inventors: Yuji Nishizawa; Masakatsu Daijo; Osamu Harada, all of Aichi,, Japan

[73] Assignee: Mitsubishi Denki K.K., Tokyo, Japan

[21] Appl. No.: 673,708

[22] Filed: Mar. 22, 1991

[30] Foreign Application Priority Data

Mar. 30, 1990 [JP] Japan ............................ 2-81280
Apr. 3, 1990 [JP] Japan ............................ 2-88857

[51] Int. Cl.⁵ ...................... H02M 1/00; H02M 5/458
[52] U.S. Cl. .................................... 363/144; 363/37; 363/141; 361/388
[58] Field of Search ................ 363/35, 37, 39, 40, 363/47, 48, 141, 144; 361/381, 383, 386, 388

[56] References Cited

U.S. PATENT DOCUMENTS

| | | | |
|---|---|---|---|
| 4,617,621 | 10/1986 | Kuroki | 363/71 |
| 4,739,447 | 4/1988 | Lecomte | 363/144 |
| 4,809,153 | 2/1989 | Bremer et al. | 363/141 |
| 4,943,904 | 7/1990 | Van Antwerp et al. | 363/144 |
| 4,992,925 | 2/1991 | Meyer | 363/141 |

FOREIGN PATENT DOCUMENTS

| | | |
|---|---|---|
| 61-227661 | 10/1986 | Japan . |
| 62-40069 | 2/1987 | Japan . |
| 62-144578 | 6/1987 | Japan . |
| 1484700 | 9/1977 | United Kingdom . |
| 2012125 | 7/1979 | United Kingdom . |
| 2214731 | 6/1989 | United Kingdom . |

Primary Examiner—Peter S. Wong
Attorney, Agent, or Firm—Sughrue, Mion, Zinn Macpeak & Seas

[57] ABSTRACT

An inverter unit for driving a motor with multi-phased currents, each of the phases being derived from a.c. input voltages that are applied to respective input terminals, rectified and smoothed by capacitors before being applied to parallel-connected switching elements to develop each of the phased a.c. outputs. The capacitors may be connected in series and/or in parallel together with the switching elements. In order to reduce the effect of the distributed inductance contributed by the conductors used to connect the capacitances and switches, and thus the need for large snubber capacitances to compensate for the distributed inductances, the connectors are given a geometry and an orientation that causes the inductances to be minimized. Specifically, the conductors are of a bus-plate form, having a large area for improving heat dissipation, and an orientation so that the magnitude and direction of currents flowing through the bus-plates tend to minimize the effect of the distributed inductances. The bus-plates may comprise one or more separate conductive plates and may be shaped to provide slots for viewing indicators on the capacitors.

16 Claims, 7 Drawing Sheets

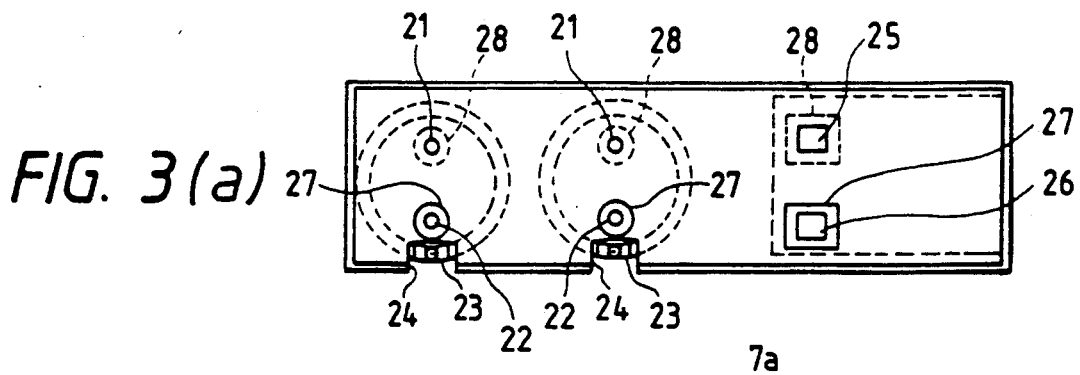
FIG. 3(a)
FIG. 3(b)
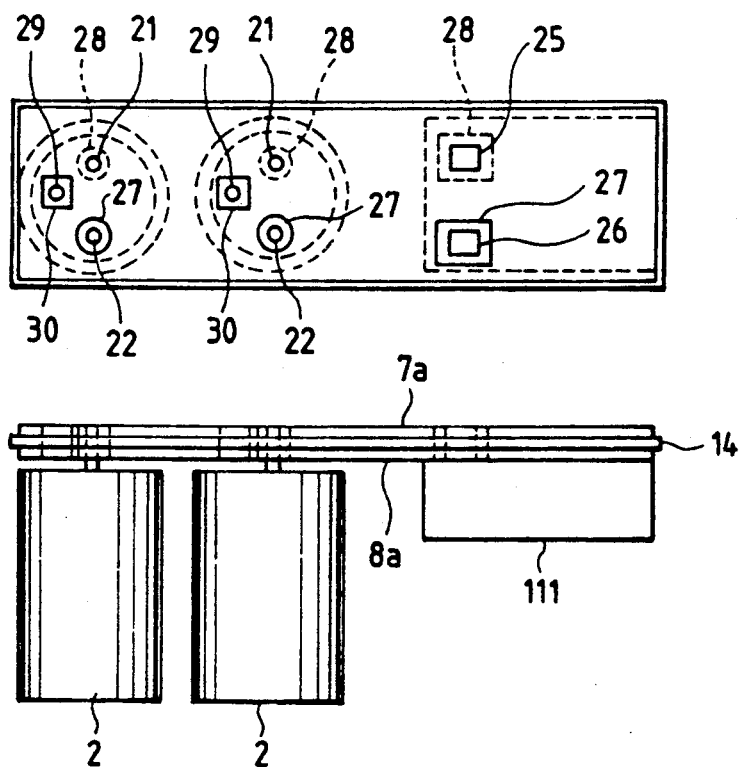
FIG. 4(a)
FIG. 4(b)

INVERTER UNIT WITH IMPROVED BUS-PLATE CONFIGURATION

BACKGROUND OF THE INVENTION

A. Field of the Invention

The present invention is an inverter unit and particularly with an inverter unit which minimizes problems resulting from wiring inductance and has improved heat dissipation. The invention employs conductors and circuit components having surface areas and geometries that reduce inductive effects, increase heat dissipation and facilitate monitoring of operation variables, such as current flow and capacitor polarity, even after assembly.

B. Description of the Background Art

FIG. 8 is a configuration diagram illustrating a connection structure of elements in a known inverter unit, wherein switching elements 1 for each phase are connected by narrow bus-bars to electrolytic capacitors 2 for smoothing a direct current. A first-pole (e.g. positive-pole) switching-element-connecting bus-bar 3 and a second-pole (e.g. negative-pole) switching-element-connecting bus-bar 4 connect the switching elements 1 in parallel. A first-pole electrolytic-capacitor-connecting bus-bar 5 and a second-pole electrolytic-capacitor-connecting bus-bar 6 connect the electrolytic capacitors 2 in parallel. Finally, a first-pole bus-bar 7 connects the first-pole switching-element-connecting bus-bar 3 and the first-pole electrolytic capacitor connecting bus-bar 5, and a second-pole bus-bar 8 connects the second-pole switching-element-connecting bus-bar 4 and the second-pole electrolytic-capacitor-connecting bus-bar 6. Snubbers 9 are connected across the first-pole and the second-pole switching-element-connecting bus-bars 3 and 4. A plurality of switching element terminal screws 10 connect the switching elements 1, the switching-element-connecting bus-bars 3 and 4, and the snubbers 9. Electrolytic capacitor terminal screws 11 connect the electrolytic capacitors 2 and the electrolytic-capacitor-connecting bus-bars 5 and 6, and bus-bar installation screws 12 connect the bus-bars 7 and 8. Three-phase, alternating-current output terminals 13 provide an alternating-current voltage converted from a direct-current voltage by each of the switching elements 1.

FIG. 9 is a connection diagram which indicates that IGBTs (Insulated Gate bipolar Transistors) are used as the switching elements 1 in the structure illustrated in FIG. 8. In FIG. 9, the switching element 1 contains two elements, i.e. first-pole IGBT 1-a and second-pole IGBT 1-b. V indicates a direct-current voltage, $I_c$ a collector current of the first-pole IGBT (1-a), and C the capacitance of the snubber 9.

FIG. 10 shows one of the three phases illustrated in FIG. 9, wherein L indicates an inductance of the bus-bars 7, 8 and the switching element connecting bus-bars 3, 4. Assume that due to a fault, the first-pole IGBT (1-a) and the second-pole IGBT (1-b) have been switched ON simultaneously, the direct-current power supply has been disconnected, and the collector current ($I_c$) is flowing from the first pole to the second pole via the first-pole IGBT (1-a) and the second-pole IGBT (1-b). Further assume that in this state, the first-pole IGBT (1-a) then is switched OFF. If there are no snubbers 9, the magnetic energy accumulated in the wiring inductance L causes the following voltage to be applied across the collector and emitter of the first-pole IGBT (1-a):

$$V_{CE} = V + L \frac{di_c}{dt} \quad (1)$$

The snubber 9 operates to absorb the magnetic energy generated by the wiring inductance L so that the voltage applied across the collector and emitter of the IGBT may not be greater than the desired rating.

In order to minimize the magnetic energy $E_M$, where $$E_M = \frac{1}{2} L I_c^2$$

the following expression must be satisfied, assuming the capacitance of the snubber 9 to be C:

$$\frac{1}{2} L I_c^2 \leq \frac{1}{2} C(V_{CEA}^2 - V^2) \quad (2)$$

In the above expression, $V_{CEA}$ is equal to the rated voltage across the collector and the emitter of the IGBT and the value of the snubber capacitance C is determined by the following expression:

$$C \geq \frac{L I_c^2}{V_{CEA}^2 - V^2} \quad (3)$$

As indicated by expression (3), the snubber capacitance C can be decreased by weakening the wiring inductance L, which leads to a reduction in the number of snubbers.

One solution to the above problem is seen in the inverter unit disclosed in Japanese Patent Disclosure Publication No. 40069 of 1987. This inverter unit is designed to weaken the wiring inductance L by employing a wiring conductor composed of a pair of conductors having a rectangular section and being laminated together via an insulating material (hereinafter referred to as the "parallel conductor design"). Use of the parallel conductor design, as disclosed in Japanese Patent Disclosure Publication No. 40069 of 1987, permits the wiring inductance L 40 be reduced. However, this design gives no consideration to improving heat dissipation or to promoting the ease of assembly.

FIG. 11 illustrates a further conventional configuration of a main circuit of a voltage-type inverter unit as described in Japanese Patent Disclosure Publication No. 40069/1987. In the Figure, P and N indicate narrow bus-bar conductors having inductances, $l_1$ and $l_2$, respectively. R, S and T are input terminals, while U, V and W are output terminals of the unit. Further, $D_1$ to $D_6$ are flywheel diodes, $D_{11}$ to $D_{16}$ are rectifying diodes, and $C_1$ and $C_2$ are smoothing capacitors which are connected in series by a conductor M. $l_0$ indicates an inductance of the conductor M, and $TR_1$ to $TR_6$ are switching elements in an inverter module, which are transistors in this example. $C_0$ indicates a snubber capacitor for surge suppression and IM is a three phase motor connected to the output terminals R, S and T. The narrow bus-bar conductors P and N are arranged parallel to each other across an insulating material Z. If an input voltage applied to the input terminals R, S and T is in the range of 400V, a direct-current voltage $V_{DC}$ is generated having an amplitude of approximately 622V ($440V \times \sqrt{2}$). Since the dielectric strength of an electrolytic capacitor usually used as the smoothing capacitor is approximately 450V, two smoothing capacitors connected in series are employed, as described above.

In an operation of the voltage-type inverter, either of the upper and lower arms of a transistor is ON and the other is OFF. The operation of driving the motor IM by means of the inverter is not covered herein because the operation is conventional and is not directly concerned with the present invention. If an accidental short occurs across the terminals U and V (as indicated by the dotted line in the Figure) with the transistors $TR_1$, $TR_3$ and $TR_5$ turned ON and the other transistors turned OFF, the energy stored in the electrolytic capacitors $C_1$ and $C_2$ causes short currents to flow through a short circuit consisting of $C_1$, $a_1$, conductor P, $TR_1$, terminal U, terminal V, $TR_5$, conductor N, $b_2$, $C_2$ $b_1$, conductor M, and $\bar{a}_2$. In order to interrupt the short currents, the transistors $TR_1$ and $TR_5$ must be turned OFF for less than several 10 $\mu S$. However, in such case, a surge voltage is generated by the inductances $l_1$ and $l_2$ of the conductors P and N because the transistors shut off a current that is several to more than 10 times higher than the ordinary current. The snubber capacitor $C_0$ for surge suppression is provided to protect the transistors from the surge voltage. Further, the narrow bus-bar conductors P and N are arranged in parallel and adjacent to each other in order to reduce the inductances $l_1$ and $l_2$. That is, since the P-side short current $i_{s1}$ and the N-side short current $i_{s2}$ are identical in magnitude and opposite in direction, magnetic fluxes caused by the short current cancel each other and, thus, weaken the effect of inductances $l_1$ and $l_2$. Needless to say, as the inductances are made smaller, the surge voltage generated at the shut-off of the short currents becomes smaller.

When the voltage of the conventional inverter unit is in the range of 400V, the inductance $l_0$ of the conductor M wired across the smoothing capacitors connected in series cannot be ignored. This inductance causes an excessive surge voltage to be applied to the smoothing capacitors and transistors.

SUMMARY OF THE INVENTION

Accordingly, it is an object of the present invention to overcome the disadvantages in the prior art by providing an easy-to-assemble inverter unit which allows the wiring inductance to be minimized and heat dissipation to be improved.

An inverter unit according to a first embodiment of the present invention includes capacitors for smoothing the direct current and switching elements for inventing the direct current into an alternating current, the positive poles of the capacitors and those of the switching elements are connected by one of a pair of conductor plates and the negative poles of the same elements are connected by another pair of conductor plates. Each pair of conductor plates are separated by an insulating plate inserted. therebetween. In addition a parallel conductor defined by each pair of conductor plates and an associated insulating plate has a surface area wide enough to cover the surfaces of the capacitors and switching elements.

The first embodiment of the present invention provides a large heat dissipation effect because the parallel conductor for connecting the capacitors for smoothing a direct current and the switching elements for inverting the direct current into an alternating current has a surface area wide enough to cover the surfaces of the capacitors and switching elements.

An inverter unit according to a second embodiment of the present invention is provided with, capacitor-monitoring notches in the parallel conductor for monitoring operation parameters of the capacitors, as indicated thereon.

This embodiment of the present invention ensures ease of checking the capacitor polarity even after assembly because the parallel conductor is provided with the notches for checking the indicated parameters of the capacitors.

In a third embodiment, the inverter unit has a converter module for converting an alternating current into a direct current, a plurality of smoothing capacitors for smoothing the direct current, an inverter module consisting of a switching element string for inverting the smoothed direct current into an alternating current. A first conductor connects the smoothing capacitors in series and second and third conductors connect the positive and negative poles of the smoothing capacitor string, comprising said plurality of the smoothing capacitors connected in series,, and connect the positive and negative poles of the switching element string in the inverter module, respectively. The first conductor is arranged adjacent and parallel to the second and third conductors across an insulating material.

BRIEF DESCRIPTION OF THE DRAWINGS

FIG. 3a and 3b are configuration diagrams illustrating a third embodiment of the present invention.

FIG. 4a and 4b are configuration diagrams illustrating a fourth embodiment of the present invention.

DESCRIPTION OF THE PREFERRED EMBODIMENTS

Embodiments of the present invention will now be described with reference to the drawings.

Figure 1:
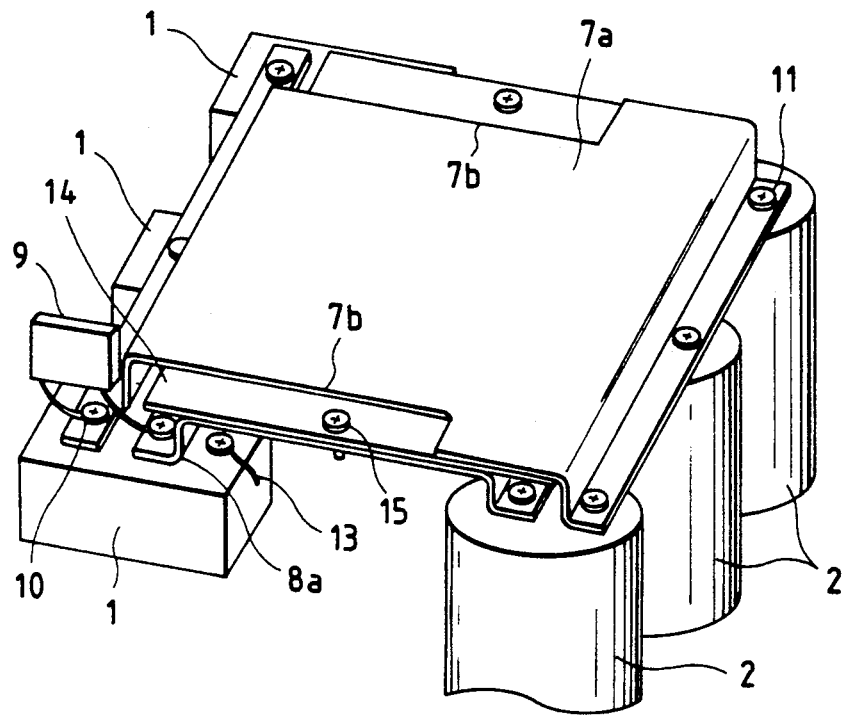
FIG. 1 is a configuration diagram illustrating a first embodiment of the present invention.

FIG. 1 is a configuration diagram illustrating a first embodiment of the present invention, wherein a switching element 1 for each phase is connected to electrolytic capacitors 2 for smoothing a direct current. A one-piece, first-pole-bus-plate 7a connects one or more first poles (e.g. positive poles) of the switching elements 1 and one or more first poles of the electrolytic capacitors 2. A one-piece, second-pole bus-plate 8a connects one or more second poles (e.g. negative poles) of the switching elements 1 and one or more second poles of the electrolytic capacitors 2. Both bus-plates 7a and 8a are made of a conductive material, such as a metal. A snubber 9 is connected across the first and the second poles of each of the switching elements 1 by switching element terminal screws 10 that also connect the bus-plates 7a, 8a to the switching elements 1. Electrolytic capacitor terminal screws 11 connect the bus-plates 7a and 8a to the electrolytic capacitors 2, and a three-phase, alternating-current output 13 provides an alternating-current voltage converted from a direct-current voltage by the switching elements 1. An insulating plate 14 is located between the first-pole and the second-pole bus-plates 7a and 8a for isolating the first and the second poles, and is held by insulating plate installation screws 15 threaded into screw holes provided in the second-pole bus-plate 8a and passed through round holes provided in the insulating plate 14. The first-pole and the second-pole bus-plates 7a, 8a and the insulating plate 14 comprise a parallel conductor. Notches 7b are provided in the first-pole bus-plate 7a for allowing the installation screws 15 to be inserted.

The first-pole and the second-pole bus-plates 7a and 8a are each a single piece of metal designed to have a wide surface area, i.e. a plurality of switching elements 1 aligned in a row and a plurality of capacitors 2 aligned in a row are opposed to each other in parallel as shown in FIG. 1, and the metal plates 7a and 8a each have a surface area wide enough to cover substantially the entire surface of the switching element row and the terminal area of the row of capacitors, including the space therebetween. In addition, the large surface area facilitates the dissipation of heat from the metal plates 7a and 8a. With this arrangement, the capacitor 2 are disposed in parallel, i.e. in line with each other and the switching elements are also disposed in parallel. The row of capacitors and the row of switch elements may be disposed in parallel to each other.

Figure 8:
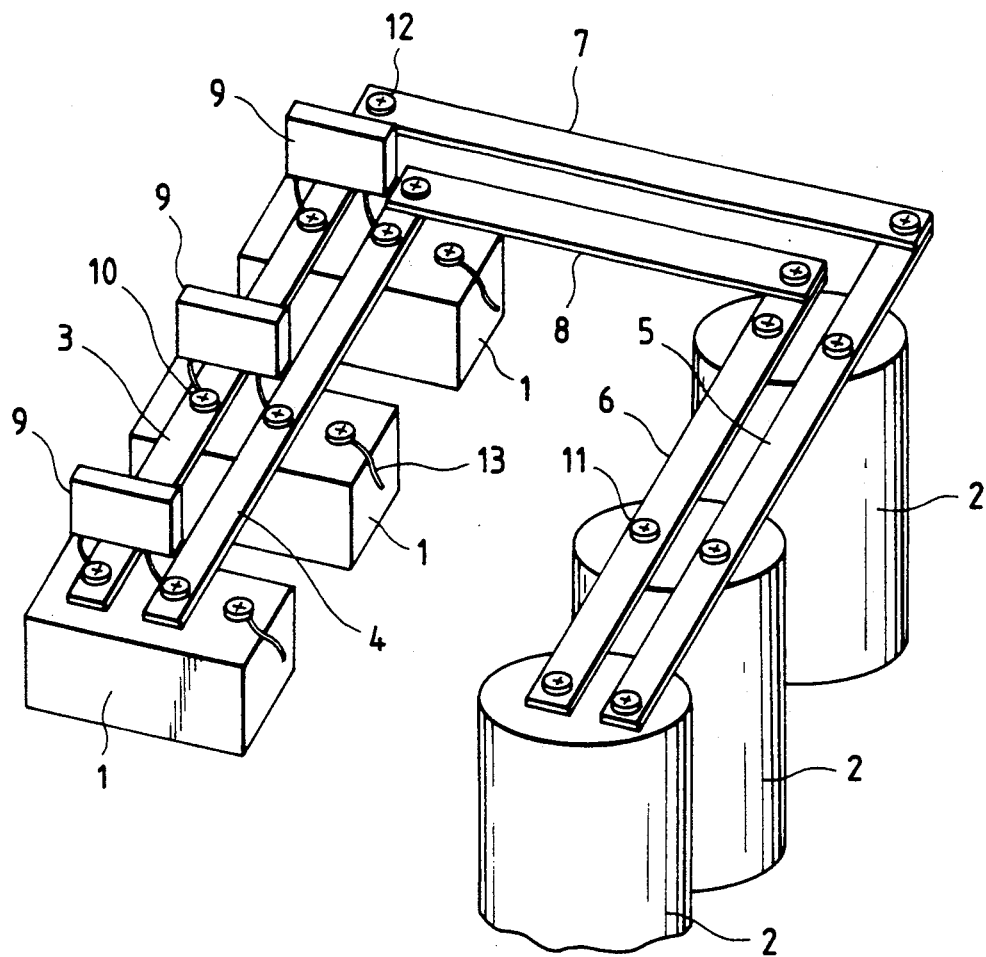
FIG. 8 is a configuration diagram illustrating a connection structure of elements in a conventional inverter unit.
Figure 9:
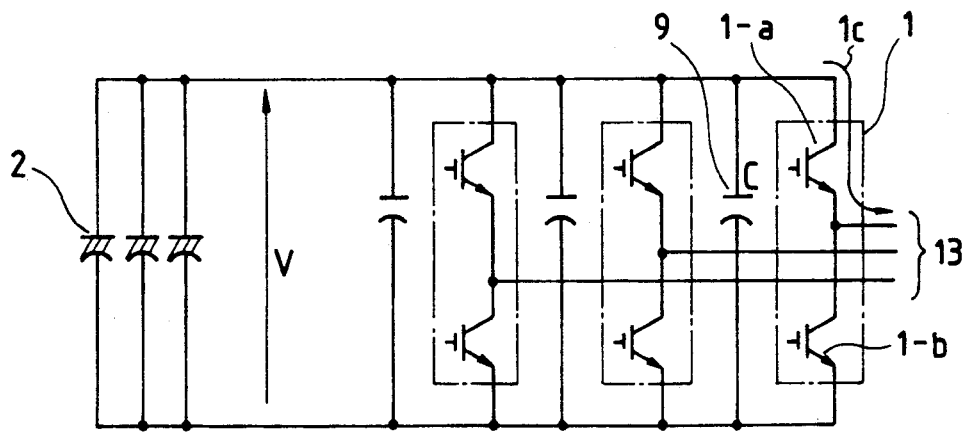
FIG. 9 is a circuit diagram of a first conventional inverter unit.
Figure 10:
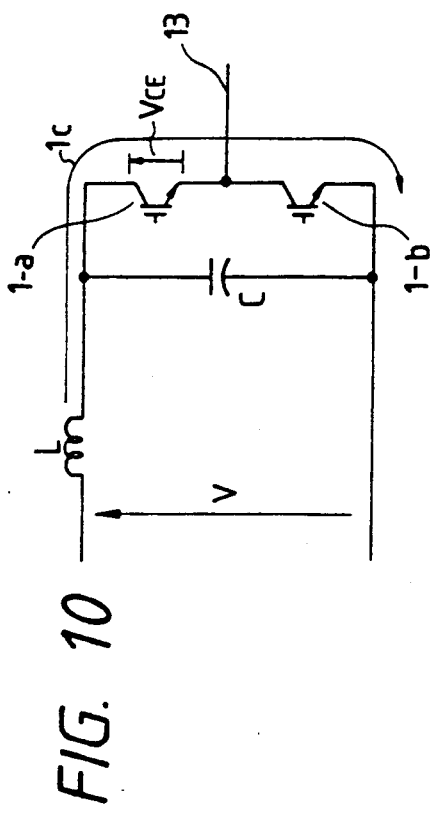
FIG. 10 is a circuit diagram illustrating only one phase of the circuit shown in FIG. 9 and used to describe the effect of a snubber.
Figure 11:
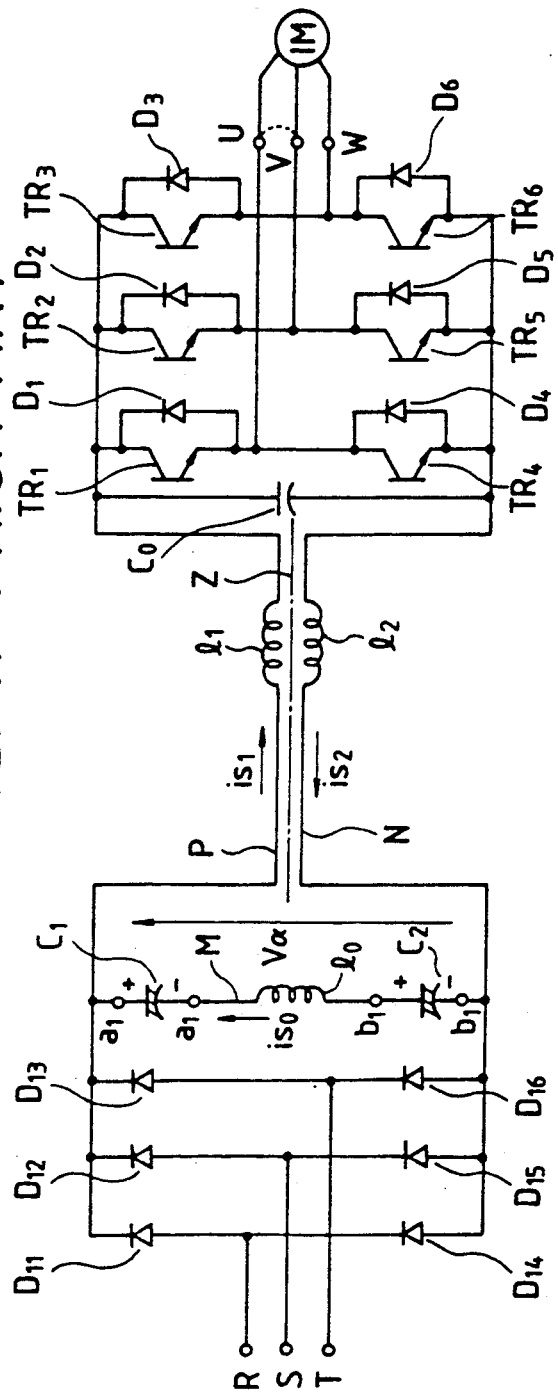
FIG. 11 is a main circuit configuration diagram of another conventional inverter unit.

While several bus-bars are combined to wire the direct-current power supply from the electrolytic capacitors 2 to the switching elements 1 in the structure shown in FIG. 8, and only a pair of metal plates 7a and 8a having a wide surface area is used in the present embodiment, the electrical circuit diagram is the same and the operation is similar. However, by opposing the two metal plates, having a wide surface area for the first and the second poles to each other, the inductance L has been reduced. Therefore, as the expression (3) indicates, the snubber capacity C can be decreased because of the minimal inductance.

A significant feature of the present invention is that heat, generated by the switching elements 1, the electrolytic capacitors 2 and the snubber 9 during operation of the inverter unit, is transmitted to the first-pole and the second-pole busplates 7a and 8a and then efficiently dissipated due to the large surface area thereof. The metal plates 7a and 8a are so large in surface area that the heat is rapidly dispersed over that area, resulting in a substantial heat dissipation effect. As a result, the temperature rise of the switching elements 1, the electrolytic capacitors 2 and the snubber 9 can be suppressed.

Additionally, the plane space is utilized more effectively, the wiring is well-balanced to an equal distance, assembly is facilitated, and structural stability is improved. For example, the insulating plate securing method in the present invention allows the insulating process to be easier than the method of screwing the first poles, the insulating plate and the second poles together, thereby reducing the number of parts and improve workability.

To produce identical effects, the IGBTs employed as the switching elements I in the above embodiment may be replaced by bipolar transistors, MOS transistors, or the like. This applies also to the second, the third, the fourth and the fifth embodiments, which will be described later.

Figure 2:
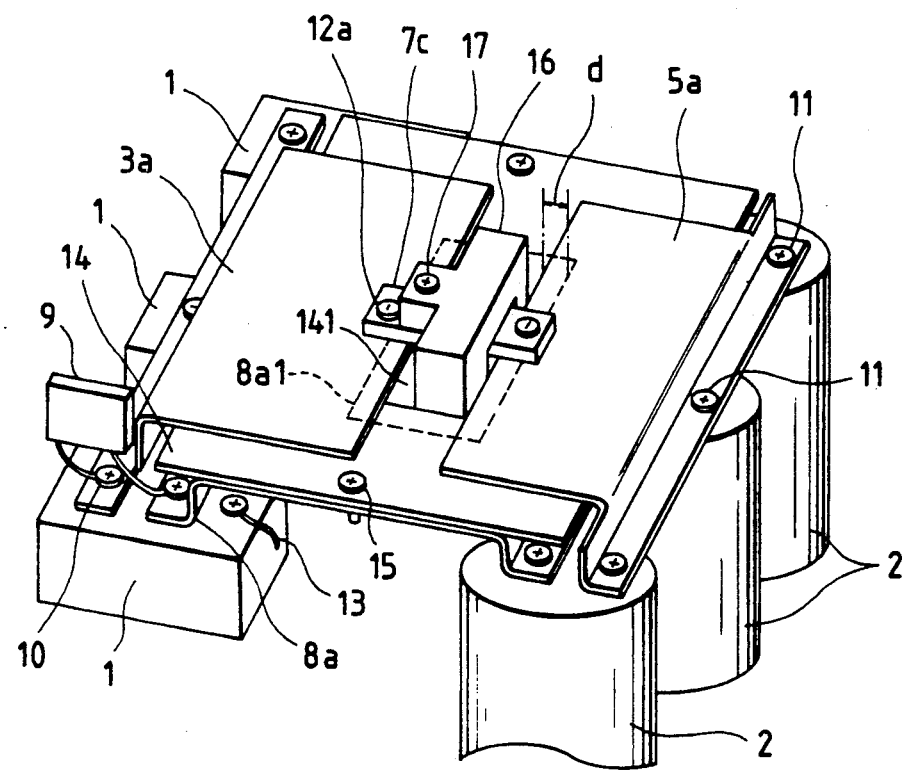
FIG. 2 is a configuration diagram illustrating a second embodiment of the present invention.

FIG. 2 shows the second embodiment of the invention which includes a current detector for detecting the current flowing in the direct-current bus wiring, i.e. collector current Ic of the IGBTs. In FIG. 2, three switching elements 1, one for each of the three phases, are connected to electrolytic capacitors 2. A first-pole, metal bus-plate 3a connects the switching elements 1 in parallel, a first-pole metal bus-plate 5a connects the electrolytic capacitors 2 in parallel, and a first-pole bus-bar 7c connects the first-pole bus-plate 3a and the first-pole bus-plate 5a. A second-pole bus-plate 8a connects second poles of the switching elements 1 and second poles of the electrolytic capacitors 2. A snubber 9 is connected across the first and the second poles of the switching elements 1, using switching element terminal screws 10 that screw into the metal plates 3a, 8a. Electrolytic capacitor terminal screws 11 connect the bus-plates 5a and 8a to the electrolytic capacitors 2, and bus-bar installation screws 12a secure the first-pole bus-bar 7c to the bus-plates 3a 5a. A three-phase, alternating-current output 13 provides an alternating-current voltage converted from a direct-current voltage by the switching elements 1. Insulating plate 14 is located between the first-pole bus-plates 3a, 5a and the second-pole bus-plate 8a for isolating the first and the second poles, and is secured by insulating plate installation screws 15 threaded into screw holes provided in the second-pole, bus-plate 8a and round holes provided in the insulating plate 14. A current detector 16 is installed over the first-pole bus-bar 7c for detecting the current flowing in the bus, i.e. the collector current $I_c$ of the IGBTs. A current detector installation screw 17 is threaded into an installation hole provided in the current detector 16 and a screw hole provided in the first-pole bus-bar 7c for fixing the current detector 16 to the first-pole bus-bar 7c. The second-pole bus-plate 8a is provided with a slot 8a1 for use as a space for installing the current detector 16, and the insulating plate 14 is provided with a similar slot 141. An insulating distance between the first and the second poles is secured by a creeping distance, d, between the end of the slot 8a1 in the metal plate 8a and the end of the slot 141 in the insulating plate 14.

The slots 141 and 8a1 provided in the insulating plate 14 and the second pole bus-plate 8, respectively, in FIG. 2 may not be required if the current detector 16 is modified to have a horizontal shape or if the first-pole bus-bar 7c is stepped so that the current detector 16 is disposed above the first-pole, bus-plate 3a and the first-pole bus-plate 5a.

Since the second embodiment comprises first-pole bus-plates 3a, 5a and a second-pole bus-plate 8a, each made of metal and having a wide surface area, a large heat, dissipation effect is produced as in the first embodiment. Further, the plane space is used effectively, the wiring is well-balanced to an identical distance, and assembly is performed more easily.

FIG. 3 is a configuration diagram illustrating the third embodiment of the present invention. Identical or corresponding parts to those in FIG. 1 are designated by identical characters and will not be described further.

Referring now to FIG. 3, a main circuit element 111 is used which comprises a switching element for each of the phases, i.e. three switching elements 1 for the three phase circuit shown in FIG. 1, encased together in one box. The capacitors 2 have positive poles 21 negative poles 22 and polarity marks 23. Notches 24 are provided in the parallel conductor for checking notations on the electrolytic capacitors 2, i.e. the polarity marks in the present embodiment. The notches 24 are provided through the bus-plates 7a, 8a and the insulating plate 14.

A negative-pole relief hole 27 is provided in the positive-pole bus-plate 7a for preventing the negative-pole terminals of the electrolytic capacitors 2 and the switching element 111 from making contact with the positive-pole bus-plate 7a. Positive-pole relief holes 28 are provided in the negative-pole terminals of the electrolytic preventing the positive-pole terminals of the electrolytic capacitors 2 and the switching element 111 from making contact with the negative-pole bus-plate 8a. The terminals of the electrolytic capacitors 2 and the switching element 111 are connected with the bus-plates 7a, 8a by conventional techniques, such as soldering or screwing.

The parallel conductor consisting of the positive-pole and the negative-pole bus-plates 7a, 8a and the insulating plate 14 also is assembled by a conventional technique (not illustrated) such as screwing.

In accordance with the third embodiment, the notches 24 allow the polarity marks to be confirmed even after the metal plates 7a and 8a have been installed. After the parallel conductor has been assembled, therefore, the polarity of the electrolytic capacitors can be determined easily and an accidental explosion due to misconnection can be prevented.

Since any polarity marks 23, other than those indicated in FIG. 3, may be used, the positions and the size of the notches 24 may be determined according to the electrolytic capacitors 2 used. The notches 24 may be through holes provided in the bus-plates 7a, 8a and the insulating plate 14 if they are not to be provided in the edge for any of a variety of reasons, such as size.

The third embodiment also produces a great heat dissipation effect and ensures ease of assembly as in the first embodiments because the connections have been made by using the bus-plates 7a and 8a having wide surface areas.

FIG. 4 is a configuration diagram showing the fourth embodiment of the present invention. Identical or corresponding parts to those in FIGS. 1 and 3 are identified by identical characters and will not be described further.

In FIG. 4, explosion-proof valves 29 and holes 30 for checking the explosion-proof valves 29 are provided through the bus-plates 7a, 8a and the insulating plate 14. The fourth embodiment allows the explosion-proof valves 29 to be checked even after the metal plates 7a and 8a, having a wide area, have been installed. Since the position of the explosion-proof valve 29 depends on that of the electrolytic capacitor 2, whether the polarity of the electrolytic capacitor 2 is correct or not can be determined by checking the explosion-proof valve 29. Hence, the present embodiment ensures ease of determining the polarity of the electrolytic capacitors 2 during post-assembly inspection to prevent an accidental explosion due to misconnection. Further, the explosion-proof valve 29 bulges if the voltage used exceeds a safe threshed voltage of the electrolytic capacitor 2. Hence, the operating status (as to the voltage) of the inverter unit can be checked during maintenance, etc., of the inverter unit. In addition, advantages identical the previous embodiments can be produced, e.g. improved heat dissipation and ease of assembling.

Figure 5A:
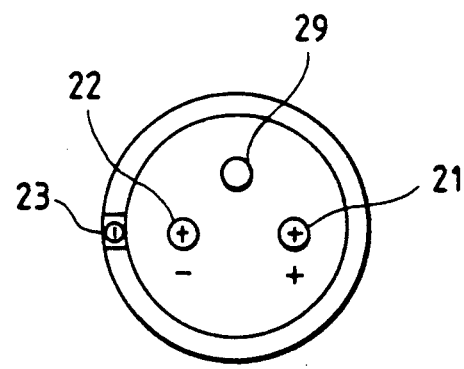
FIG. 5a and 5b are diagrams employed to describe a general electrolytic capacitor.
Figure 5B:
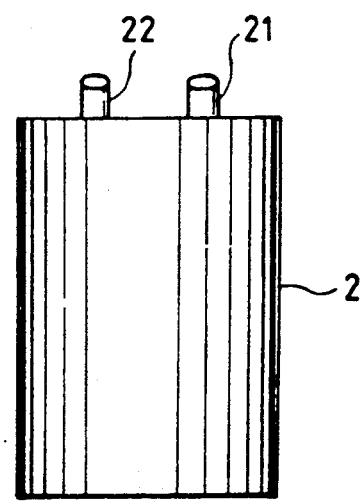

FIG. 5 illustrates the polarity mark 23 of a general electrolytic capacitor 2 and the explosion-proof valve 29.

Figure 6A:
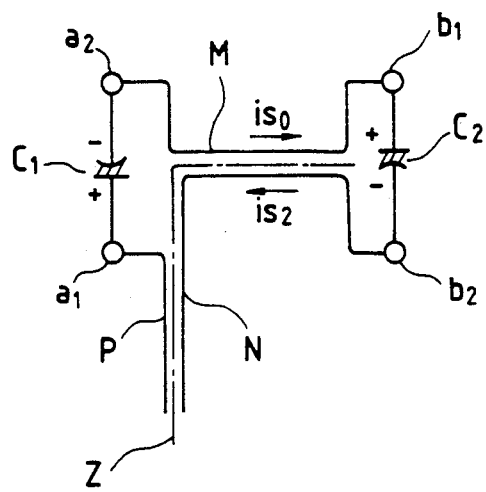
FIGS. 6A, 6B, 6C and 6D illustrate a circuit that shows the operation of fifth through eighth embodiments of the present invention.

Fifth and sixth embodiments of the present invention will now be described in reference to FIGS. 6A and 6B, respectively, which illustrate the principle of the present invention. In FIG. 6A, conductors M and P of a capacitor $C_1$ are arranged adjacent and parallel to each other, and since a short current $i_{s0}$ flowing in the conductor M and a short current $i_{s2}$ flowing in the conductor N are identical in magnitude and opposite in flowing direction, magnetic fluxes generated by said short currents cancel each other to reduce the inductance between the conductors M and N. Instead of the conductors M and N in FIG. 6A, the conductors M and P may be arranged adjacent and parallel to each other.

Figure 6B:
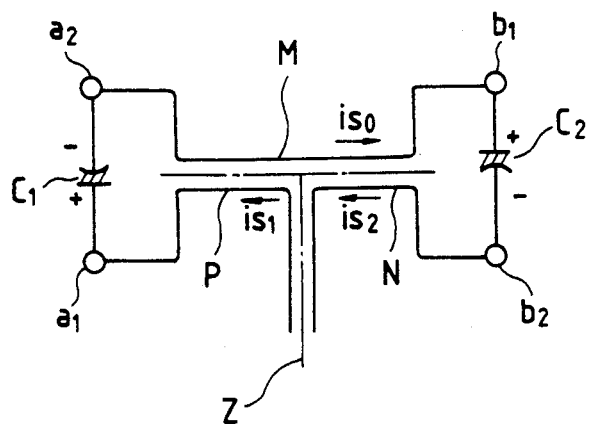

In FIG. 6B, a portion of the conductor M is arranged adjacent and parallel to the conductor P and other portions of the conductor M are parallel to the conductor N to weaken the inductance. This method allows the conductors P and N to be taken from the center of the capacitors $C_1$ and $C_2$.

Figure 7A:
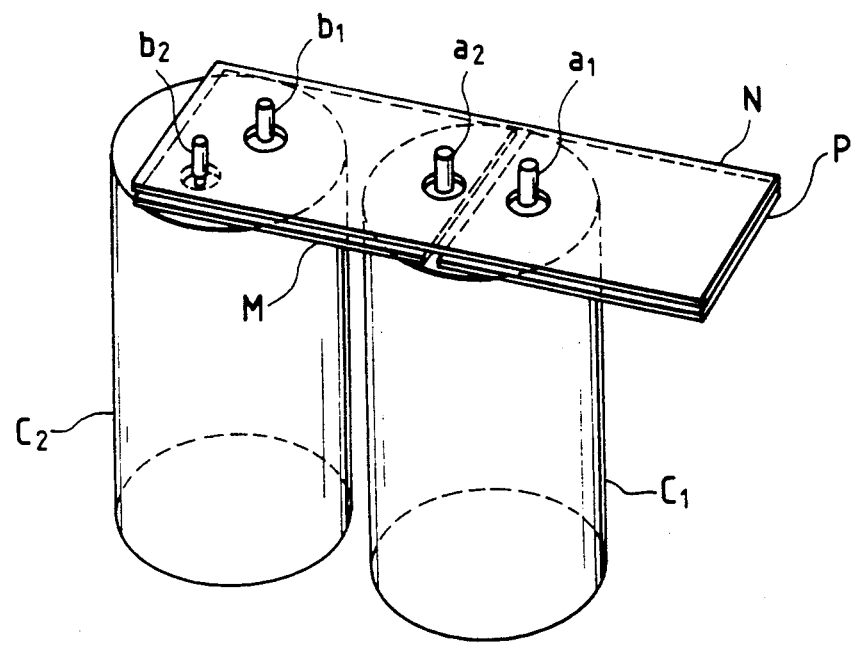
FIG. 7A is a perspective side view illustrating arrangement relationships between capacitors and conductors according to a fifth embodiment of the present invention.

FIG. 7A illustrates a physical realization of the fifth embodiment seen in FIG. 6A. Referring to FIG. 7A, a terminal $a_1$ of the electrolytic capacitor $C_1$ is connected with the conductor P, and a terminal $a_2$ of the electrolytic capacitor $C_1$ and a terminal $b_1$ of the electrolytic capacitor $C_2$ are connected by the conductor M. An insulating material Z (not shown) is arranged between the conductor N and the conductors P and M.

Figure 7B:
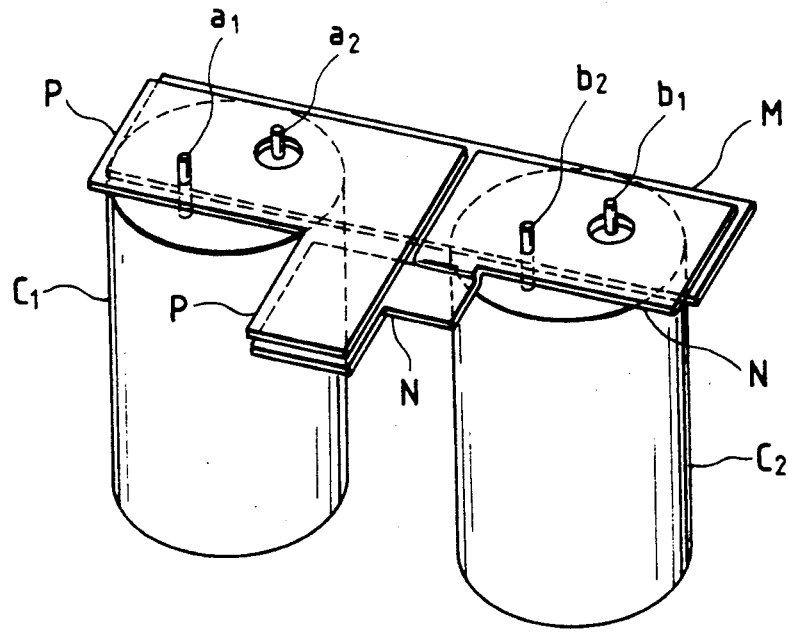
FIG. 7B is a perspective side view illustrating arrangement relationships between capacitors and conductors according to a sixth embodiment of the present invention.

FIG. 7B illustrates the sixth embodiment which has achieved the idea shown in FIG. 6B, wherein the conductor M is connected with the terminal $a_2$ of the electrolytic capacitor $C_1$ and the terminal $b_1$ of the electrolytic capacitor $C_2$. The conductor P is connected with the terminal $a_1$ of the electrolytic capacitor $C_1$ and the conductor N with the terminal $b_2$ of the electrolytic capacitor $C_2$. To arrange the conductors M and P adjacent and parallel to each other in FIG. 7A instead of the conductors M and N, the conductor P may be replaced by the conductor N, the conductor N by the conductor P, and the terminals $a_1$ and $a_2$ by the terminals $b_1$ and $b_2$.

Figure 6C:
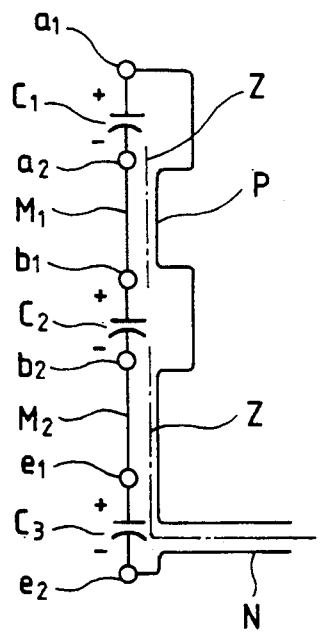
Figure 6D:
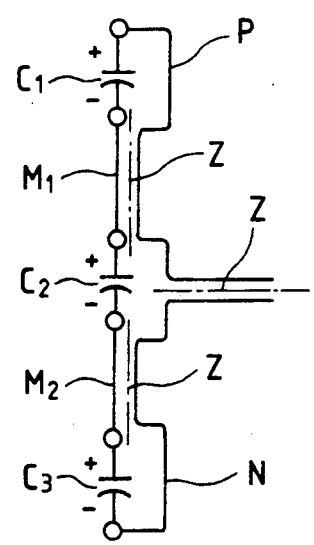

By arranging the conductors as shown in the seventh and eighth embodiments of FIGS. 6A and 6D respectively, the inductances of the conductors connected with the capacitors can be reduced when three electrolytic capacitors are connected in series. Referring to FIG. 6C, $C_3$ indicates a third capacitor and its terminals are $e_1$ and $e_2$. In FIG. 6D, conductors $M_1$ and $M_2$, connected with the smoothing capacitors, are arranged adjacent and parallel to the conductor P. In FIG. 6D, the conductor $M_1$ is arranged adjacent and parallel to the conductor P and the conductor $M_2$ to the conductor N. In FIG. 6D, the conductors P and N can be taken from the center of the capacitor arrangement. It will be appreciated that the same effect may be produced by replacing the transistors, employed as the switching elements of the inverter module in the embodiment, with MOSFET's or IGBT.

It will be apparent that the first embodiment of the present invention, as described above, not only weakens the inductance of the wiring but also disperses heat from the parallel conductor and improves the heat dissipation effect because the surface area of the parallel conductor for connecting the capacitors and the switching elements is wide enough to cover the surfaces of the capacitors and the switching elements. Further, the first embodiment connects each of the first and the second poles with one metal plate to decrease the number of members used and to greatly reduce the number of assembling processes so that a low-cost inverter unit may be provided.

It will also be apparent that the second embodiment of the present invention, as described previously, provides the capacitor indication checking notches for the parallel conductor described in the first embodiment to ensure ease of checking whether the polarity of any capacitor is correct or not, even after assembling, in addition to the effects of the first embodiment. The third and fourth embodiments provide further advantages to those discussed above.

It will be apparent that the invention of the fifth through eighth embodiments allow the inductances at the series connections of a plurality of smoothing capacitors connected in series to be weakened and permits a surge voltage caused by short current shut-off at the occurrence of an accidental short to be reduced by arranging a conductor connecting smoothing capacitors adjacent and parallel to conductors connected to switching elements.

What is claimed is:

1. An inverter unit comprising:
    a plurality of capacitors for smoothing a direct current, each of said capacitors having a capacitor pole surface containing first polarity capacitor poles and second polarity capacitor poles and defining a first pole surface area;
    a plurality of switching elements for inverting said direct current into an alternating current, each of said switching elements having a switching pole surface containing first polarity switching poles and second polarity switching poles and defining a second pole surface area;
    insulating plate means for providing electrical insulation and defining an insulating surface area;
    first bus-plate means for electrically connecting said first polarity capacitor poles and said first polarity switching poles, said first bus-plate means defining a first plate area that is at least the size of the area defined by the total of said first and second surface areas;
    second bus-plate means for connecting said second polarity capacitor poles of said capacitors and said second polarity switching poles, said second bus-plate means defining a second plate area;
    said first and second bus-plate means being disposed with said first plate area and said second plate area substantially adjacent to each other and said insulating plate being disposed therebetween.

2. The inverter unit of claim 1 wherein at least one of said capacitor surfaces areas has an indicator thereon and at least one of said first and second bus-plate means is shaped to permit said indicator on said at least one of said capacitor surface areas to be seen.

3. The inverter unit of claim 1 wherein at least one of said capacitors has explosion-proof valve means disposed at said capacitor pole surface area thereof and at least one of said first and second conductor plate means is shaped so as to permit said valve means to extend therethrough.

4. The inverter unit of claim 1 wherein at least one of said adjacent bus-plate means and said insulating means have substantially the same plate surface areas.

5. The inverter unit of claim 1 wherein said first bus-plate means comprises a current detector means conducively connected between two bus plate halves.

6. The inverter unit of claim 5 wherein said second bus-plate means is shaped so as to non-conducively intersect said current detector means.

7. The inverter unit of claim 1 wherein at least one of said adjacent bus-plate means is shaped to permit at least one of said first or second poles to nonconductively pass through said bus-plate means.

8. The inverter unit of claim 1 wherein at least two of said capacitors are connected in parallel.

9. The inverter unit of claim 1 wherein at least two of said capacitors are connected in series.

10. The inverter unit of claim 1 wherein said first bus-plate means is operative to conduct current in a first direction and at a first magnitude and said second plate means is operative to conduct current in a second direction, opposite to said first direction, and at a magnitude substantially equal to said first magnitude.

11. The inverter unit of claim 1 wherein each of said bus-plate means comprises at least one bus-plate and is sized and oriented with respect to the other so that the currents flowing through at least one bus-plate of said first bus-plate means are equal and opposite in direction to the currents flowing through at least one bus-plate of said second bus-plate means, whereby an inductance associated with the bus-plates is reduced.

12. The inverter unit of claim 11 wherein each of said first and second bus-plate means is sized to have a plate area greater than the total of said first and second pale surfaces areas.

13. The inverter unit of claim 1 wherein at least one of said first and second bus-plate means comprises a plurality of plates.

14. The inverter unit of claim 13 wherein at each of said first and second bus-plate means comprises a plurality of bus-plates and said insulating plate means comprises a plurality of insulating plates, said insulating plates being disposed between oppositely disposed bus-plates of said first and second bus-plate means.

15. The inverter of claim 1, further comprising heat dissipating means having at least one of heat dissipating surface.

16. The inverter of claim 15, wherein said heat dissipating means comprises said first and second bus-plate means and said heat dissipating surfaces comprises said first and second plate areas.

* * * * *